(12) United States Patent
Heid

(10) Patent No.: US 6,504,370 B2
(45) Date of Patent: Jan. 7, 2003

(54) GRADIENT COIL SYSTEM

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/010,509

(22) Filed: Dec. 7, 2001

(65) Prior Publication Data

US 2002/0070730 A1 Jun. 13, 2002

(30) Foreign Application Priority Data

Dec. 8, 2000 (DE) .......................................... 100 61 301

(51) Int. Cl.⁷ ................................................. G01V 3/00
(52) U.S. Cl. ........................................ 324/318; 324/319
(58) Field of Search ................................ 324/318, 319, 324/320, 322, 300, 306, 307, 309, 312, 314

(56) References Cited

U.S. PATENT DOCUMENTS

| 4,881,035 A | 11/1989 | Siebold ...................... 324/320 |
| 5,028,872 A | * 7/1991 | Nakabayashi ................ 324/318 |
| 5,497,773 A | * 3/1996 | Kuhara et al. ............... 324/318 |
| 5,675,255 A | 10/1997 | Seller et al. ................. 324/318 |
| 6,078,177 A | * 6/2000 | Petropoulos et al. ........ 324/318 |

FOREIGN PATENT DOCUMENTS

| DE | 42 25 592 | 2/1994 |
| GB | 2 207 764 | 2/1989 |

* cited by examiner

Primary Examiner—Louis Arana
(74) Attorney, Agent, or Firm—Schiff Hardin & Waite

(57) ABSTRACT

A gradient coil system for a magnetic resonance apparatus has at least one gradient coil for generating a magnetic gradient field at least within an imaging volume, the gradient field having a main field component co-linear with a basic magnetic field and at least one accompanying field component perpendicular to the main field component, and an electrically conductive shield for shielding the accompanying field component, at least toward the imaging volume.

13 Claims, 4 Drawing Sheets

GRADIENT COIL SYSTEM

BACKGROUND OF THE INVENTION

1. Field of the Invention

The present invention is directed to a gradient coil system, particularly for a magnetic resonance apparatus.

2. Description of the Prior Art

Magnetic resonance technology is a known technology for acquiring images of the inside of the body of an examination subject. In a magnetic resonance apparatus, rapidly switched gradient fields that are generated by a gradient system are superimposed on a static basic magnetic field that is generated by a basic field magnet system. The magnetic resonance apparatus further has a radio-frequency system that emits radio-frequency signals into the examination subject for triggering magnetic resonance signals and that picks up the generated magnetic resonance signals, from which magnetic resonance images are generated.

The gradient system includes gradient coils and controlled gradient amplifiers. Each of the gradient coils generates a gradient field for a specific spatial direction, this gradient field—in the desirable ideal case—being formed exclusively comprises a main field component that is co-linear with the basic magnetic field at least within the imaging volume. The main field component has a prescribable main gradient that is of approximately the same magnitude, independent of location, at any arbitrary point in time, at least within the imaging volume. Since the gradient field is temporally variable magnetic field, the above characteristics are applicable in fact applies for every point in time; however, the strength of the main gradient is variable from one point in time to another point in time. The direction of the main gradient is usually rigidly prescribed by the design of the gradient coil.

Due to Maxwell's fundamental equations, however, and contrary to the desired, ideal case, no gradient coil can be fashioned that exclusively generates the aforementioned main field component over the imaging volume. The main field component is unavoidably accompanied by at least one secondary field component that is perpendicular to the main field component.

For generating the gradient field, suitable currents are set in the gradient coil. The amplitudes of the required currents amount to several 100 A. The current rise and decay rates (slew rate) amount to several 100 kA/s. The gradient coil is connected to a controlled gradient amplifier for the power supply.

In magnetic resonance image exposures, stimulations can be triggered in a living examination subject by the switching of the gradient fields. The gradient fields acting on the examination subject are characterized by a time-varying, magnetic flux density that generates eddy and induction currents in the examination subject. The strength of these electrical currents is dependent on, among other things, the cross-sectional area that the gradient field penetrates as well as on the time variation of the gradient field. These currents flow through regions of the examination subject with different electrical conductivity and thereby produce corresponding electrical voltages. When the voltage exceeds a specific threshold, this leads to the triggering of stimulations of the examination subject. For example, German OS 42 25 592 discloses an arrangement wherein the highest current or voltage values given switched gradient fields are induced at the edge of or outside the imaging volume where the field boost of the magnetic flux density of the gradient field is maximum, so that the risk of stimulations is greatest there.

In order to avoid such stimulations, German OS 42 25 592 discloses that stimulation-sensitive regions outside the imaging volume be covered with a closed conductor loop. A reduction of the currents induced in the covered region results therefrom. These coverings, however, are only possible outside the imaging volume and also are not possible in edge regions of the imaging volume because the linearity of the gradient fields in the imaging volume, which is important for the image quality, and the homogeneity of the basic magnetic field are otherwise deteriorated. It is also disadvantageous that the position of the conductor loops usually also must be adapted given a change of the region of the examination subject to be imaged.

In the context of a hollow-cylindrical gradient coil system, German OS 195 27 020 discloses a combination of a segment gradient coil and a gradient coil constructed of saddle-shaped sub-coils for a transverse gradient coil. The advantages of both types of gradient are intended to be preserved and their disadvantages reduced at the same time due to the combination. One disadvantage of the gradient coil constructed of saddle-shaped sub-coils is stated to be that it exhibits a strong accompanying field component that is stronger than the usable main field component. Among other things, the accompanying field component and, thus, the risk of stimulations due to rapidly switched gradients are intended to be noticeably reduced by the combination.

Further, a shielding arrangement is known, for example from European Application 0 317 853 or British Specification 2 207 764 which is intended to prevent a field emanating from a current-permeated gradient coil system from penetrating into parts of a basic field magnet system that surrounds the gradient coil system.

SUMMARY OF THE INVENTION

An object of the present invention is to provide an improved gradient coil system with which, among other things, high intensities of a rapidly switched gradient field can be achieved without causing stimulations in a living examination subject.

This object is achieved in a gradient coil system according to the invention having at least one gradient coil for generating a magnetic gradient field at least within an imaging volume, the gradient field having a main field component co-linear with a basic magnetic field and at least one accompanying field component perpendicular to the main field component, and an electrically conductive shield for shielding the accompanying field component, at least toward the imaging volume.

The inherently undesired accompanying component thus can be attenuated at least in a region in which a living subject is to be examined with the magnetic resonance technique. As a result, the gradient field permeating the examination subject can be reduced to the main field component effective for magnetic resonance imaging and thus a stimulation probability of the examination subject can be diminished, or the usable intensity of the gradient field can be increased. One advantage of the shield is that its effect is limited only to fast changes of the gradient field that are particularly responsible for stimulations. The maximally obtainable gradient strength of a gradient filed for a longer time segment, wherein the strength does not vary over time, is not reduced.

DESCRIPTION OF THE PREFERRED EMBODIMENTS

Figure 1:
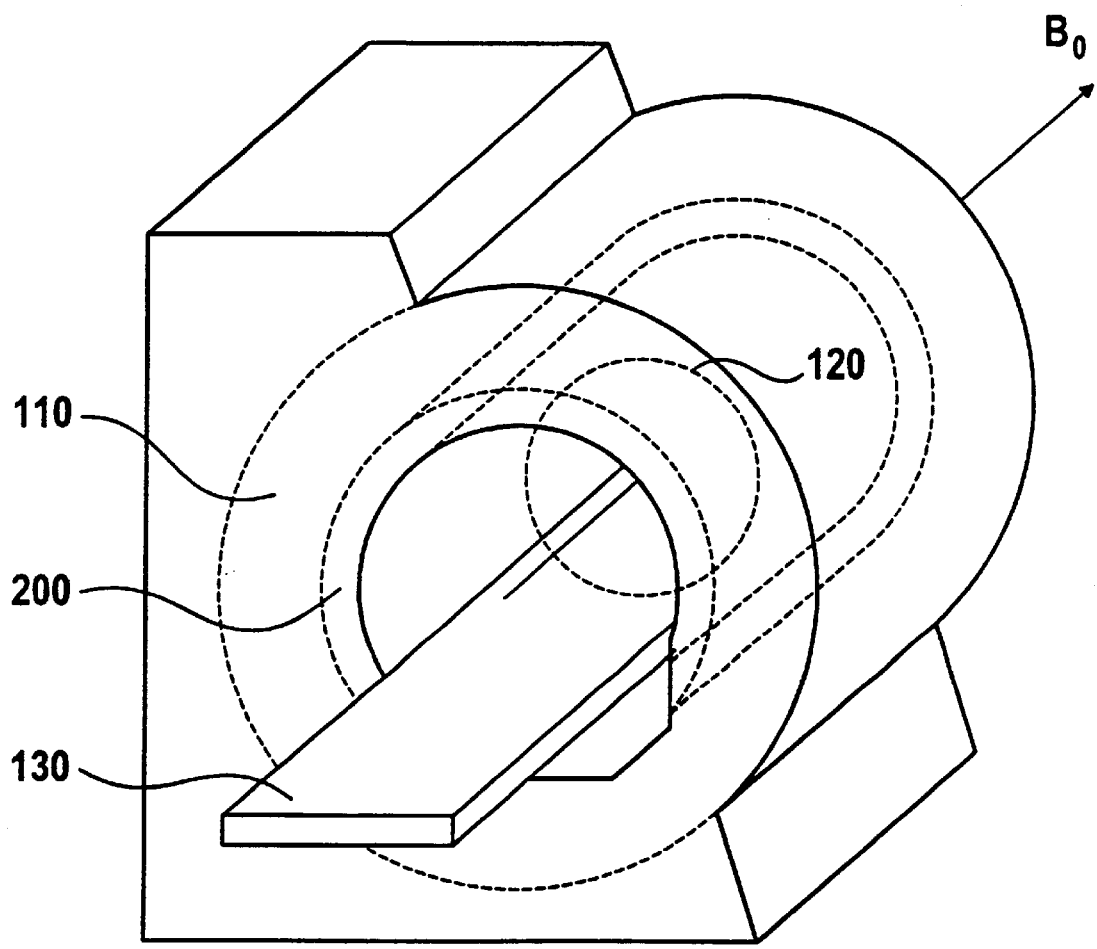
FIG. 1 schematically illustrates a magnetic resonance apparatus.

FIG. 1 is a perspective view of a magnetic resonance apparatus. For generating a static basic magnetic field $B_0$ that is optimally uniform at least within an imaging volume, the magnetic resonance apparatus has a basic field magnet system 110. Further, the magnetic resonance apparatus has a gradient coil system 200 for generating gradient fields. Among other things, a movable support mechanism 130 of the apparatus serves the purpose of positioning an image region of an examination subject carried on the bearing mechanism 130 in the imaging volume 120. For reasons of clarity, further components of the apparatus, for instance an antenna system, are not shown.

The gradient coil system 200 is fashioned essentially hollow-cylindrically and contains—among other things—a longitudinal gradient coil for generating a magnetic gradient field with a main gradient in the direction of the basic magnetic field $B_0$, two transverse gradient coils for generating magnetic gradient fields with main gradients perpendicular to the basic magnetic field $B_0$, cooling devices, shim devices and shielding coils allocated to the respective gradient coils.

Figure 2:
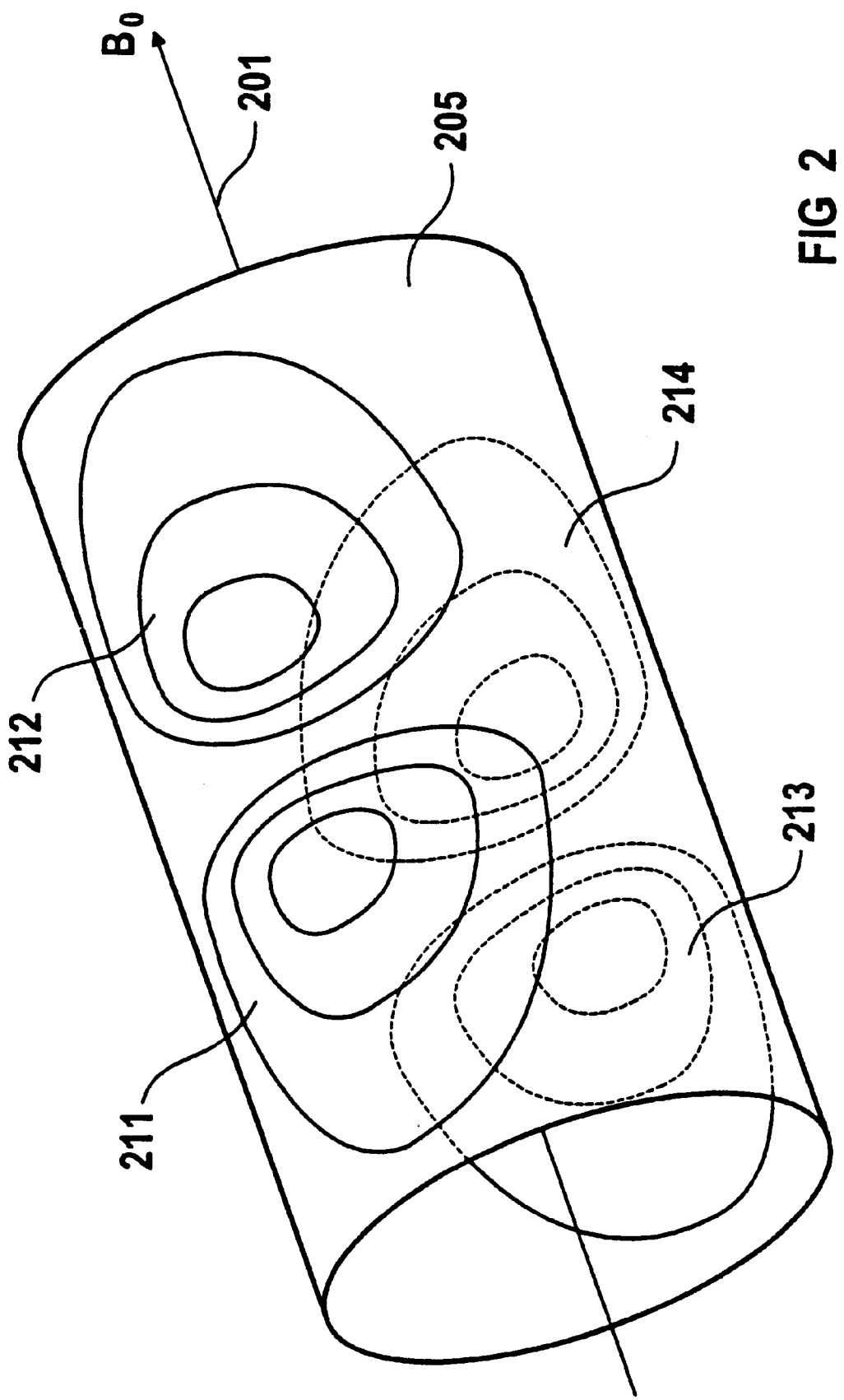
FIG. 2 shows a layer of a hollow-cylindrical gradient coil system of the magnetic resonance apparatus in accordance with the invention.

FIG. 2 shows a hollow-cylindrical layer 205 of the gradient coil system 200 within which one of the transverse gradient coils is arranged. The transverse gradient coil has four sub-coils 211 through 214 each fashioned saddle-shaped, for example of a type referred to as fingerprint coils. The path of a conductor for each of the sub-coils 211, 212, 213 and 214 is outlined schematically, shown with few turns as an example. The hollow-cylindrical gradient coil system 200 has a principal axis 201 of the hollow cylinder that is parallel to a direction vector of the basic magnetic field $B_0$.

Figure 3:
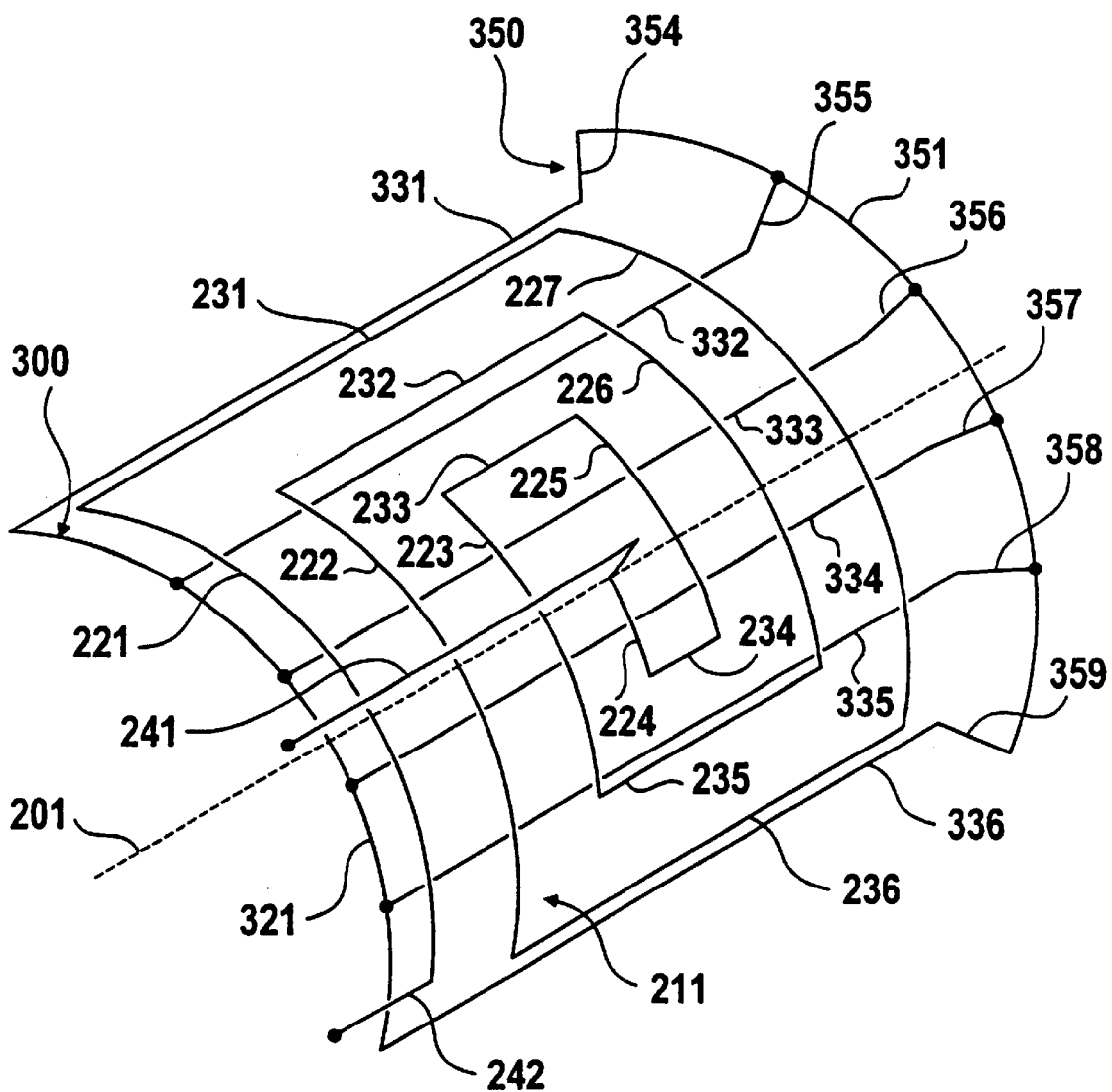
FIG. 3 shows a sub-region of a shield in a first embodiment for a saddle coil.

As an example of the invention for a saddle coil, FIG. 3 shows a sub-region 300 of a shield in a first embodiment. For explanation, the sub-coil 211 fashioned saddle-shaped in FIG. 2 is used as an example. The sub-coil 211 is shown idealized in FIG. 3 and is essentially composed of arcuate conductor sections 221 through 227 proceeding in circumferential direction of the hollow cylinder, and straight, longitudinal conductor sections 231 through 236 that proceed parallel to the principal axis 201 of the hollow cylinder. The arcuate conductor sections 221 through 227 are essentially responsible for producing the desired main field component of the gradient field that can be generated by the gradient coil. In contrast thereto, the longitudinal conductor sections 231 through 236 are essentially responsible for producing at least one inherently undesired accompanying field component of the gradient field that can be generated by the gradient coil. The sub-coil 211 also has terminal conductor sections 241 and 242 via which a corresponding current supply of the sub-coil 211 can be implemented.

The sub-region 300 of a shield is allocated to the sub-coil 211 for shielding the accompanying field component, at least with respect to a region wherein a living examination subject can extend. The sub-region 300 of the shield is formed of straight, longitudinal conductor sections 331 through 336 proceeding parallel to the principal axis 2012 of the hollow cylinder, that are spaced from each other in the circumferential direction of the hollow cylinder, an arcuately fashioned connecting conductor section 321 in the circumferential direction of the hollow cylinder, as well as a comb-like connecting conductor section 350 fashioned. The comb-like connecting conductor section 350 has an arcuately fashioned conductor section 351 as well as a number of conductor sections 354 through 359 proceeding in radial direction. The ends of the longitudinal conductor sections 331 through 336 that correspond to one another are electrically conductively connected to one another by the connecting conductor sections 321 and 350.

The longitudinal conductor sections 331 through 336 as well as the arcuate connecting conductor section 341 of the sub-region 300 of the shield are arranged electrically insulated from the conductor of the sub-coil 211 in. for example, a hollow-cylindrical layer immediately under the layer 205 of the sub-coil 211. The longitudinal conductor sections 331 through 336 of the sub-region 300 of the shield are arranged in close proximity to the longitudinal conductor sections 231 through 236 of the sub-coil 211. In contrast thereto, the arcuate conductor section 351 of the comb-like connecting conductor section 350 is arranged within the gradient coil system 200 as far as possible toward the exterior. This prevents shield currents flowing in the arcuate conductor section 351 from having a disruptive effect with respect to the imaging volume. The same effect can be achieved in other embodiments of a sub-region of a shield by widening the sub-region of the shield allocated to a sub-coil with a funnel-shape, at least at one longitudinal end, or with a correspondingly large longitudinal expanse that proceeds beyond that of the sub-coil.

The functioning of the sub-region 300 of the shield is essentially based on the time-varying currents flowing in the longitudinal conductor sections 231 through 236 of the sub-coil 211 inducing corresponding but oppositely directed shield currents in the longitudinal conductor sections 331 through 336 of the sub-region 300 of the shield by means of a high inductive coupling. The current paths of the shield currents are closed by the connecting conductor sections 321 and 350 and other longitudinal conductor sections 331 through 336. The magnetic field accompanying the shield currents induced in the longitudinal conductor sections 331 through 336 compensate the accompanying field component and leave the main field component of the gradient field of the transverse gradient coil uninfluenced. No induction of shield currents in the subregion 300 of the shield occurs due to the time-varying currents flowing in the arcuate conductor sections 221 through 227 of the sub-coil. The reason for this is that, due to the arrangement of conductor sections of the sub-region 300 of the shield, inductive coupling between the sub-region 300 of the shield and the arcuate conductor sections 221 through 227 of the sub-coil 211 is negligible.

The above-described sub-region 300 of the shield is correspondingly provided for all sub-coils 211 through 214 to form a shield for the entire transverse gradient coil. A corresponding shield is provided for the further transverse gradient coil. In one embodiment, a common shield is correspondingly fashioned and arranged for both transverse gradient coils.

Figure 4:
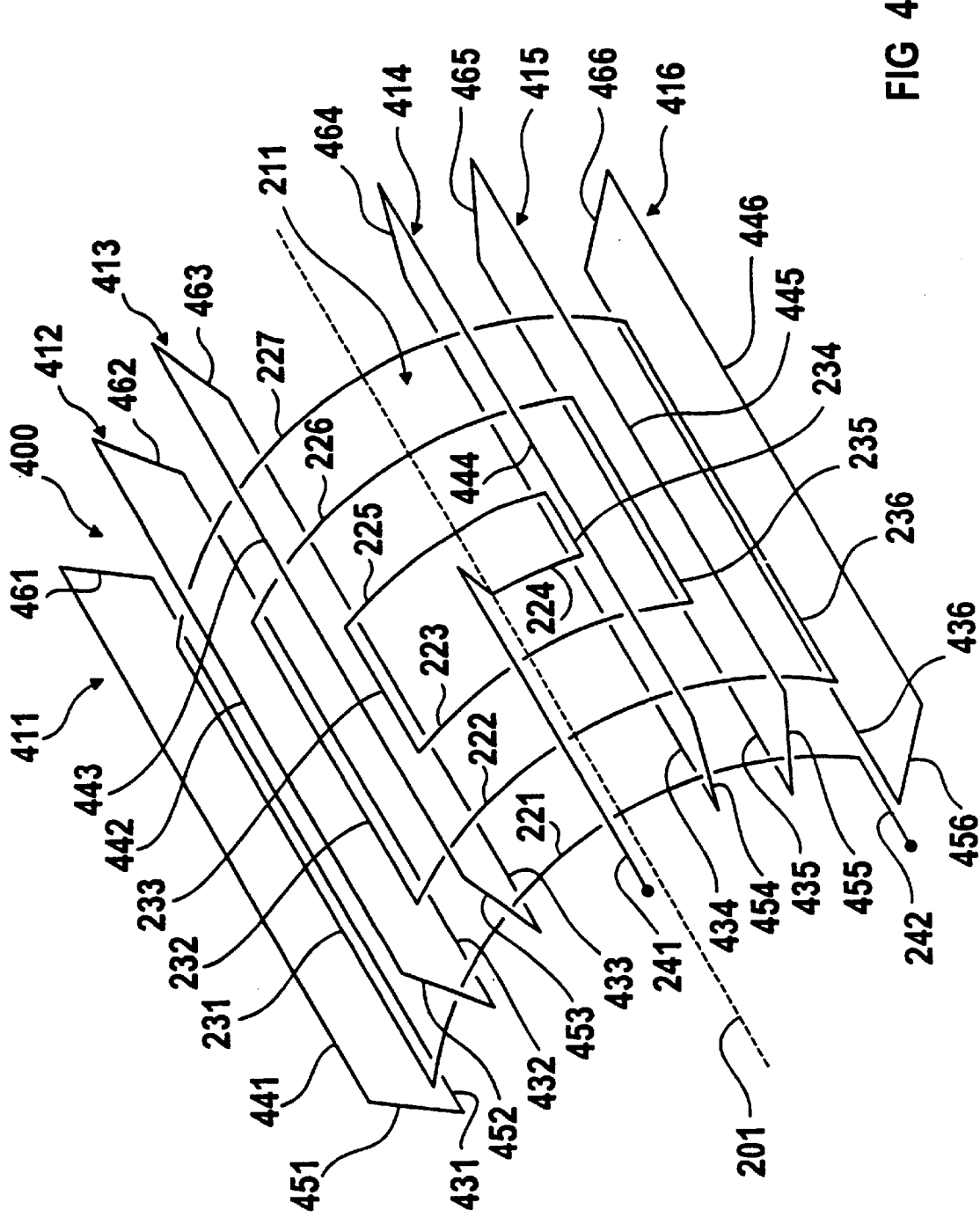
FIG. 4 shows a sub-region of a shield in a second embodiment for a saddle coil.

As a further exemplary embodiment of the invention for a saddle coil, FIG. 4 shows a sub-region 400 of a shield in a second embodiment thereof. The sub-coil 211 is saddle-shaped and has the structure described in detail with reference to FIG. 3, and is used as an example for this explanation. For shielding an accompanying field component caused by the sub-coil 211, the sub-region 400 of the shield has six conductor loops 411 through 416. Each of the conductor loops 411 through 416 has a longitudinal conductor section 431 through 436 that, in close proximity to a corresponding longitudinal conductor section 231 through 236 of the sub-coil, is arranged in a layer under the layer 205 of the sub-coil 211 and is electrically insulated from the conductor of the sub-coil 211. Further, each of the conductor loops 411 through 416 has a second longitudinal conductor section 441 through 446 that has a larger spacing from the principal axis 201 of the hollow cylinder than the appertaining, first longitudinal conductor section 431 through 436. The second longitudinal conductor sections 441 through 446 are arranged within the gradient coil system 200 as far as possible toward the exterior in order to optimally prevent a disturbing effect in the imaging volume 120 of shielding currents flowing in the longitudinal conductor sections 441 through 446. In each conductor loop 411 through 416, the first longitudinal conductor sections 431 through 436 are respectively electrically conductively connected to the second longitudinal conductor sections 441 through 446 by correspondingly radially fashioned conductor sections 451 through 456 and 461 through 466. The functioning set forth for FIG. 3 as to the sub-region 300 of the shield applies correspondingly to the sub-region 400.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a magnetic resonance apparatus having a basic field magnet which generates a basic magnetic field containing an imaging volume, and having a patient-receiving volume, larger than and containing said imaging volume, the improvement of a gradient coil system comprising:

at least one gradient coil which generates a magnetic gradient field within said patient receiving volume, said gradient field comprising a main field component that is collinear with said basic magnetic field, and at least one accompanying field component perpendicular to said main field component; and an electrically conductive shield for shielding said patient-receiving volume from accompanying field component.

2. The improvement of claim 1 wherein said gradient coil comprises at least one conductor section that substantially generates said accompanying field component, and wherein said shield comprises a shield conductor section allocated to said conductor section of said gradient coil.

3. The improvement of claim 2 wherein said shield conductor section is disposed substantially parallel to a longitudinal direction of said basic magnetic field.

4. The improvement of claim 2 wherein said conductor section of said gradient coil comprises a conductor section component parallel to said longitudinal direction of said basic magnetic field.

5. The improvement of claim 2 wherein said shield conductor section is disposed in close proximity to said conductor section of said gradient coil.

6. The improvement of claim 2 wherein said shield conductor section is encompassed by at least one closed conductor path formed by said shield.

7. The improvement of claim 1 wherein said gradient coil system has a shape approximating a hollow cylinder, said hollow cylinder having a principle axis substantially parallel to said basic magnetic field. and wherein said gradient coil comprises at least one saddle-shaped sub-coil.

8. The improvement of claim 7 wherein said shield has at least one sub-region comprising longitudinal conductor sections respectively spaced from each other along a circumferential direction of said hollow cylinder, and two connecting conductor sections that electrically conductively connect corresponding ends of the respective longitudinal conductor sections to each other.

9. The improvement of claim 8 wherein at least one of said connecting conductor sections is arcuate.

10. The improvement of claim 8 wherein at least one of said connecting conductor sections is a comb-like connecting conductor section having an arcuate portion spaced farther from said principle axis of said hollow cylinder than said longitudinal conductor sections.

11. The improvement of claim 8 wherein said sub-coil and said sub-region of said shield have substantially equal surface coverage.

12. The improvement of claim 7 wherein said shield has at least one sub-region comprising a closed conductor loop, said closed conductor loop being formed by at least one first longitudinal conductor section allocated to said sub-coil, at least one second longitudinal conductor section disposed at a larger spacing from said principle axis of said hollow cylinder than said first longitudinal conductor section, and two radially disposed conductor sections that electrically conductive connect the first longitudinal conductor section and the second longitudinal conductor section to each other.

13. The improvement of claim 12 wherein said first longitudinal conductor section and said sub-coil have approximately equal longitudinal lengths.

* * * * *